US012772525B2

(12) United States Patent
Chen et al.

(10) Patent No.: US 12,772,525 B2
(45) Date of Patent: Oct. 20, 2026

(54) COMPOSITE STRUCTURE, METHOD FOR MANUFACTURING THE SAME AND NON-VOLATILE OPTICAL MEMORY DEVICE

(71) Applicant: National Cheng Kung University, Tainan City (TW)

(72) Inventors: Chia-Yun Chen, Tainan City (TW); Zhe-Hao Liu, Keelung City (TW); Kuan-Han Lin, Tainan City (TW); Jheng-Yi Li, Kaohsiung City (TW)

(73) Assignee: National Cheng Kung University, Tainan City (TW)

( * ) Notice: Subject to any disclaimer, the term of this patent is extended or adjusted under 35 U.S.C. 154(b) by 364 days.

(21) Appl. No.: 18/539,313

(22) Filed: Dec. 14, 2023

(65) Prior Publication Data

US 2025/0142917 A1 May 1, 2025

(30) Foreign Application Priority Data

Oct. 26, 2023 (TW) ................................ 112140959

(51) Int. Cl.
*H10D 62/80* (2025.01)
*H10B 69/00* (2023.01)

(52) U.S. Cl.
CPC ........... *H10D 62/882* (2025.01); *H10B 69/00* (2023.02)

(58) Field of Classification Search
CPC .... H10B 69/00; H10D 62/882; H10F 77/1433
See application file for complete search history.

(56) References Cited

PUBLICATIONS

Mahima Chaudhary et al., Nitrogen-Doped Carbon Quantum Dots on Graphene for Field-Effect Transistor Optoelectronic Memories , Adv. Electron. Mater. 2023, 9, 2300159, published online: Jun. 14, 2023 (Year: 2023).*
Wikipedia, Graphene, archived Aug. 5, 2022 (Year: 2022).*
Siyu Zhou et al., Non-volatile optical memory in vertical van der Waals heterostructures, Journal of Semiconductors (2020) 41, 072906 (Year: 2020).*
Ya Lin et al., Photo-tunable organic resistive random access memory based on PVP/N-doped carbon dot nanocomposites for encrypted image storage, J. Mater. Chem. C, 2020, 8, 14789 (Year: 2020).*
Siyu Zhou and Bo Peng, "Non-volatile optical memory in vertical van der Waals heterostructures", Journal of Semiconductors, 41(7), 2020, 072906, cover page & pp. 1-5. ,2020.
Sihyun Sung, Chaoxing Wu, Hyun Soo Jung & Tae Whan Kim, "Highly-stable write-once-read-many-times switching behaviors of 1D-1R memristive devices based on graphene quantum dot nanocomposites", Scientific Reports, 8(1), 2018, 12081,pp. 1-7. ,Aug. 31, 2018.

* cited by examiner

*Primary Examiner* — Shih Tsun A Chou
(74) *Attorney, Agent, or Firm* — Winston Hsu

(57) ABSTRACT

A composite structure includes a dielectric layer, a two-dimensional graphene layer and a carbon quantum dot film. The dielectric layer is disposed on a first surface of a silicon substrate. The two-dimensional graphene layer is disposed on the dielectric layer. The carbon quantum dot film is disposed on the two-dimensional graphene layer.

8 Claims, 10 Drawing Sheets

COMPOSITE STRUCTURE, METHOD FOR MANUFACTURING THE SAME AND NON-VOLATILE OPTICAL MEMORY DEVICE

BACKGROUND OF THE INVENTION

1. Field of the Invention

The present disclosure relates to a composite structure, a method for manufacturing the same and a non-volatile optical memory device having the same, and more particularly, to a composite structure including a carbon quantum dot film and a two-dimensional graphene layer, a method for manufacturing the same and a non-volatile optical memory device having the same.

2. Description of the Prior Art

With the vigorous development of frontier technologies, such as Internet of Things (IoT), edge computing and artificial intelligence, huge information processing capabilities are required, and memory devices play an indispensable role. However, today's memory devices convert information into 0 and 1 signals and store information in a two-bit configuration. When the information that needs to be processed is huge, the memory units required by the memory device also need to be increased accordingly. As a result, the volume is bulky and the power consumption is increased. Therefore, how to improve the properties of memory devices, such as increasing memory density to reduce the overall volume and/or the power consumption, has become an important issue for relevant industries.

SUMMARY OF THE INVENTION

According to one embodiment of the present disclosure, a composite structure includes a dielectric layer, a two-dimensional graphene layer and a carbon quantum dot film. The dielectric layer is disposed on a first surface of a silicon substrate. The two-dimensional graphene layer is disposed on the dielectric layer. The carbon quantum dot film is disposed on the two-dimensional graphene layer.

According to another embodiment of the present disclosure, a method for manufacturing a composite structure includes steps as follows. A composite substrate is provided, wherein the composite substrate includes a silicon substrate and a dielectric layer disposed on a first surface of the silicon substrate. A two-dimensional graphene layer is formed on the dielectric layer. A carbon quantum dot film is formed on the two-dimensional graphene layer.

According to yet another embodiment of the present disclosure, a non-volatile optical memory device includes the aforementioned composite structure and a light module for providing a light to the composite structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

<Method for Manufacturing Composite Structure>

Figure 1:
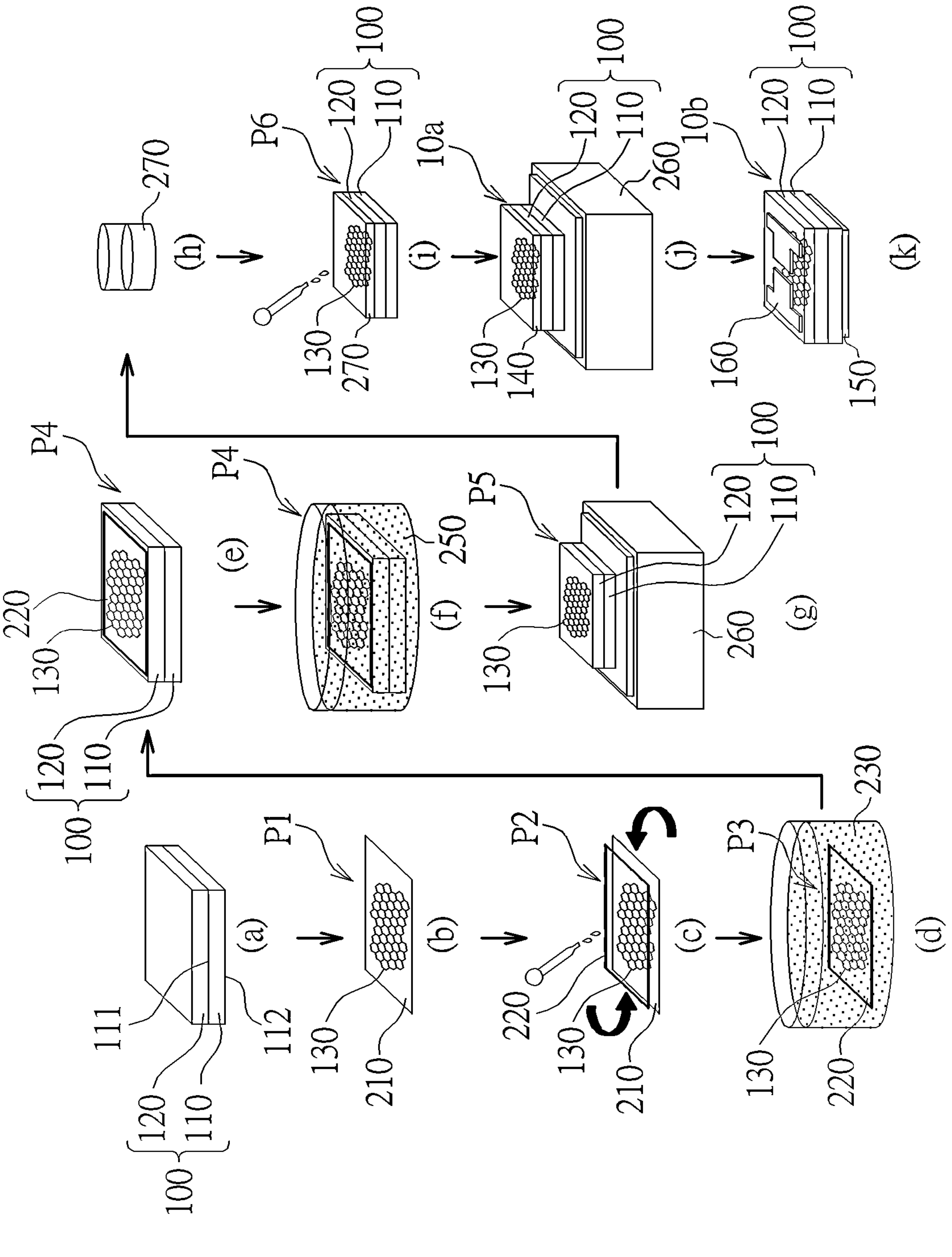
FIG. 1 is a schematic diagram showing steps of a method for manufacturing a composite structure according to an embodiment of the present disclosure.

Please refer to FIG. 1, which is a schematic diagram showing steps of a method for manufacturing a composite structure according to an embodiment of the present disclosure. In the part (a) shown in FIG. 1, a composite substrate 100 is provided. The composite substrate 100 includes a silicon substrate 110 and a dielectric layer 120 disposed on a first surface 111 of the silicon substrate 110. The silicon substrate 110 is a doped silicon substrate. For example, the silicon substrate 110 may be doped with n-type dopants, such as arsenic and phosphorus, so as to be an n-type silicon substrate. Alternatively, the silicon substrate 110 may be doped with p-type dopants, such as boron and indium, so as to be a p-type silicon substrate. The resistivity of the silicon substrate 110 may be 0.01 Ω·cm to 0.05 Ω·cm. Thereby, it is beneficial to allow the silicon substrate 110 to provide a conductive function. The thickness T1 (see FIG. 3) of the silicon substrate 110 may be 510 μm to 540 μm. Thereby, it is beneficial to allow the silicon substrate 110 to provide a supporting function. The resistivity and the thickness T1 of the silicon substrate 110 are exemplary and may be adjusted according to actual needs to allow the silicon substrate 110 to provide the required conductive function and supporting function.

The dielectric constant of the dielectric layer 120 may be 3.9 to 4.5. The dielectric layer 120 is for providing an insulating function. Moreover, in the composite structure 10*b* which is subsequently formed, when a voltage is applied to the silicon substrate 110 (for example, the voltage may be applied to the silicon substrate 110 by the first electrode 150 which is subsequently formed), the dielectric layer 120 can generate induced charges to neutralize the charges in the two-dimensional graphene layer 130 and the carbon quantum dot film 140, i.e., the dielectric layer 120 may provide an erasing function. Therefore, materials that can provide these two functions (the insulating function and the erasing function) are suitable to be the material of the dielectric layer 120 according to the present disclosure. According to an example of the present disclosure, the material of the dielectric layer 120 may include silicon dioxide ($SiO_2$), but not limited thereto. The ratio of the thickness T2 (see FIG. 3) of the dielectric layer 120 to the thickness T1 of the silicon substrate 110 may be 2E-4 to 6E-4. The thickness T2 of the dielectric layer 120 may be 100 nm to 300 nm. According to an example of the present disclosure, the thickness T2 of the dielectric layer 120 is 150 nm.

In the part (b) to part (g) shown in FIG. 1, a two-dimensional graphene layer 130 is formed on the dielectric layer 120. Herein, the two-dimensional graphene layer 130 is formed on the dielectric layer 120 by a wet transfer process. First, as shown in the part (b) of FIG. 1, the two-dimensional graphene layer 130 is formed on a metal substrate 210 to form an intermediate product P1. The metal substrate 210 may be a copper foil, and the thickness (not labeled) of the copper foil may be, for example, 0.025 mm. Thereby, the metal substrate 210 has sufficient supporting capacity and is easy to be removed by etching in the subsequent process. The two-dimensional graphene layer 130 may be formed on the metal substrate 210 by chemical vapor deposition (CVD). In the present disclosure, the two-dimensional graphene (also called graphene) refers to a planar sheet having a thickness of single atom and is composed of carbon atoms with $sp^2$ bonding, and the carbon atoms are arranged in a honeycomb lattice. In the present disclosure, the two-dimensional graphene layer 130 may include one layer of two-dimensional graphene or multiple layers of two-dimensional graphene, and the number of the layers of the two-dimensional graphene may adjusted according to the required thickness T3 (see FIG. 3) of the two-dimensional graphene layer 130. The ratio of the thickness T3 of the two-dimensional graphene layer 130 to the thickness T1 of the silicon substrate 110 may be 9E-6 to 2E-5. According to an example of the present disclosure, the thickness T3 of the two-dimensional graphene layer 130 may be 5 nm to 10 nm. According to an example of the present disclosure, the thickness T3 of the two-dimensional graphene layer 130 is 5 nm.

In the part (c) shown in FIG. 1, a polymer material 220 is formed on the two-dimensional graphene layer 130 to form an intermediate product P2. The intermediate product P2 includes, from bottom to top, the metal substrate 210, the two-dimensional graphene layer 130 and the polymer material 220. For example, the polymer material 220 may be coated on the two-dimensional graphene layer 130 by spin coating. Specifically, the polymer material 220 may be firstly prepared as a polymer spin coating liquid by being mixed with a solvent such as acetone. After the polymer spin coating liquid is spin coated on the two-dimensional graphene layer 130, a baking step may be performed to remove the solvent in the polymer spin coating liquid and to allow the polymer material 220 to solidify to become a film. The spin coating may be performed at a rotational speed of 3000 rpm to 4000 rpm for 30 seconds to 60 seconds. The spin coating may be performed at room temperature. The aforementioned baking step may be performed at 70° C. to 90° C. for 10 minutes to 30 minutes, but not limited thereto. The temperature and time of the baking step may be adjusted according to the type and amount of solvent in the polymer spin coating liquid. According to an example of the present disclosure, the polymer material 220 is poly(methyl methacrylate) (PMMA), but not limited thereto. Polymer materials that have an etching selectivity ratio with respect to the metal substrate 210 are suitable to be the polymer material 220 of the present disclosure.

In the part (d) shown in FIG. 1, the metal substrate 210 is removed to form an intermediate product P3. The intermediate product P3 includes, from bottom to top, the two-dimensional graphene layer 130 and the polymer material 220. Herein, the intermediate product P2 is immersed in an etching solution 230, and the metal substrate 210 is removed by etching, so as to obtain the intermediate product P3. According to an example of the present disclosure, the metal substrate 210 is a copper foil, the etching solution 230 is a ferric nitrate solution of 1 M to 1.5 M, and the etching time is 12 hours to 24 hours. However, the present disclosure is not limited thereto. The type and the concentration of the etching solution 230 and etching time may be adjusted according to the material and the size of the metal substrate 210.

In the part (e) shown in FIG. 1, the intermediate product P3 is supported with the composite substrate 100 to form an intermediate product P4. The intermediate product P4 includes, from bottom to top, the silicon substrate 110, the dielectric layer 120, the two-dimensional graphene layer 130 and the polymer material 220. Prior to this, the intermediate product P3 may be immersed in deionized water (not shown) one or more times to remove the residual etching solution 230. After the intermediate product P3 is supported with the composite substrate 100 to form the intermediate product P4, a baking step may be performed to remove the liquid (such as deionized water) on the intermediate product P4. The baking time may be 0.5 hours, and the baking temperature may be 150° C., but not limited thereto.

In the part (f) shown in FIG. 1, the polymer material 220 is removed to form an intermediate product P5. As shown in the part (g) of in FIG. 1, the intermediate product P5 includes, from bottom to top, the silicon substrate 110, the dielectric layer 120 and the two-dimensional graphene layer 130. Please refer back to the part (f) shown in FIG. 1, the polymer material 220 is removed by immersing the intermediate product P4 in an organic solvent 250 to dissolve the polymer material 220. According to an example of the present disclosure, the polymer material 220 is PMMA, the organic solvent 250 is acetone, the immersing time is 48 hours to 72 hours, and the immersing temperature is 65° C. to 80° C. However, the present disclosure is not limited thereto. The type of the organic solvent 250, the immersing time and the immersing temperature may be adjusted according to the type of the polymer material 220.

As shown in the part (g) of FIG. 1, after the polymer material 220 is removed, a baking step may be performed to remove the organic solvent 250 on the intermediate product P5. Herein, the intermediate product P5 is baked with a heating device 260, the baking time may be 20 minutes to 30 minutes, and the baking temperature may be 200° C., but not limited thereto. The baking time and the baking temperature may be adjusted according to the type of the organic solvent 250 and the residual amount of the organic solvent 250 on the intermediate product P5. With the step, it can prevent the organic solvent 250 from remaining on the intermediate product P5. When the organic solvent 250 remains on the intermediate product P5, the remaining organic solvent 250 may evaporate to form voids in the carbon quantum dot film 140 which is formed in the following step due to the thermal treatment process. When the voids are formed in the carbon quantum dot film 140, the stack uniformity and the conductivity of the carbon quantum dots 141 (see FIG. 6) may be affected.

As shown in the part (b) to the part (g) of FIG. 1, with the wet transfer process, it is beneficial to determine the area of the two-dimensional graphene layer 130 by defining the size of the metal substrate 210, and the two-dimensional graphene layer 130 may only be disposed on one surface of the dielectric layer 120. If the two-dimensional graphene layer 130 is formed on the composite substrate 100 by chemical vapor deposition (CVD), it is possible that the two-dimensional graphene layer 130 covers the entire composite substrate 100. As a result, in the composite structures 10*a* and 10*b* which are subsequently formed, the part above the dielectric layer 120 and the part below the dielectric layer 120 are electrically connected with each other, so that the composite structures 10*a* and 10*b* cannot work.

In the part (h) to the part (j) shown in FIG. 1, the carbon quantum dot film 140 is formed on the two-dimensional graphene layer 130, so that the manufacture of the composite structure 10*a* is completed. First, as shown in the part (h) of FIG. 1, a carbon quantum dot precursor solution 270 is provided. The carbon quantum dot precursor solution 270 may include a carbon-containing material and an acidic substance. The carbon-containing material may include, for example, glucose. The acidic substance may include, for example, acidic solutions with a concentration of 0.2 M to 2 M, such as aqueous solutions of nitric acid, sulfuric acid, acetic acid and hydrochloric acid, but not limited thereto. Next, as shown in the part (i) of FIG. 1, the carbon quantum dot precursor solution 270 is coated on the two-dimensional graphene layer 130 to form an intermediate product P6. The intermediate product P6 includes, from bottom to top, the silicon substrate 110, the dielectric layer 120, the two-dimensional graphene layer 130 and the carbon quantum dot precursor solution 270. Herein, the carbon quantum dot precursor solution 270 is coated on the two-dimensional graphene layer 130 by a drop-casting process. The temperature of the carbon quantum dot precursor solution 270 may be adjusted to 80° C. to 100° C. before performing the drop-casting process.

Next, as shown in the part (j) of FIG. 1, a thermal treatment process is performed, so that the carbon quantum dot precursor solution 270 is converted into the carbon quantum dot film 140. Herein, the intermediate product P6 is heated with the heating device 260. The ratio of the thickness T4 (see FIG. 3) of the carbon quantum dot film 140 to the thickness T1 of the silicon substrate 110 may be 2E-4 to 3E-4. The thickness T4 of the carbon quantum dot film 140 may be 130 nm to 200 nm. According to an example of the present disclosure, the thickness T4 of the carbon quantum dot film 140 is 150 nm.

Figure 2:
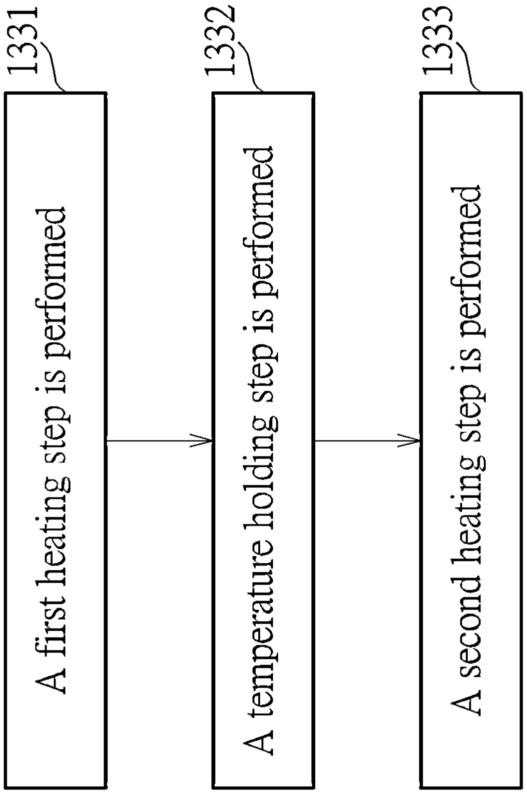
FIG. 2 is a flow diagram of a thermal treatment process according to an embodiment of the present disclosure.

Please refer to FIG. 2, which is a flow diagram of a thermal treatment process according to an embodiment of the present disclosure, in which the thermal treatment process includes Step 1331 to Step 1333. In Step 1331, a first heating step is performed to achieve to a first predetermined temperature. In Step 1332, a temperature holding step is performed to maintain the first predetermined temperature for a predetermined period. In Step 1332, the carbon-containing material is decomposed and nucleated to form carbon quantum dots 141 (see FIG. 6), and the particle sizes D1 (see FIG. 6) of the carbon quantum dots 141 are gradually increased. In Step 1333, a second heating step is performed, in which the first predetermined temperature is raised to a second predetermined temperature. Step 1333 is for annealing, so that the carbon quantum dots 141 (see FIG. 6) can be arranged more tightly, which is beneficial for the transport of carriers. The first predetermined temperature may be 100° C. to 200° C., the predetermined period may be 2 hours to 12 hours, the second predetermined temperature may be 300° C. to 500° C., or the second predetermined temperature may be 380° C. to 400° C. According to an example of the present disclosure, the first predetermined temperature is 150° C., the predetermined period is 2 hours to 12 hours, and the second predetermined temperature is 400° C. In addition, in Step 1333, the temperature may be increased 50° C. every half hour, but not limited thereto.

As shown in the part (k) of FIG. 1, a first electrode 150 is formed on a second surface 112 of the silicon substrate 110 opposite to the first surface 111, and two second electrodes 160 spaced apart from each other are formed on the carbon quantum dot film 140, so as to process the composite structure 10*a* to form the composite structure 10*b*. With the first electrode 150 and the second electrodes 160, it is beneficial to electrically connect the composite structures 10*a* and 10*b* with other elements (such as a power module). The first electrode 150 and the second electrodes 160 may be formed by an e-beam evaporator process, and may be formed in different steps. For example, the first electrode 150 may be formed firstly and then the second electrodes 160 are formed, but not limited thereto. The shapes of the first electrode 150 and the second electrodes 160 may be defined by an aluminum metal mask. For example, before performing the e-beam evaporator process, the aluminum metal mask may be covered on the region where the first electrode 150 and the second electrodes 160 are not to be formed. During the electron beam evaporation process, the electron beam bombards the metal target, so that free metal ions are deposited on the region not covered by the aluminum metal mask to form the first electrode 150 and the second electrodes 160. The materials of the first electrode 150 and the second electrodes 160 may be gold, silver, copper, aluminum or a combination thereof. The thickness T5 of the first electrode 150 may be 50 nm to 1000 nm, and the thickness T6 of the second electrode 160 may be 50 nm to 1000 nm, but not limited thereto, and may be flexibly adjusted according to actual needs. In addition, the thickness T5 of the first electrode 150 and the thickness T6 of the second electrode 160 may be the same or different.

As shown in FIG. 1, when the method for manufacturing the composite structure does not include forming the first electrode 150 and the second electrodes 160, the product of the method for manufacturing the composite structure is the composite structure 10*a*. When the method for manufacturing the composite structure includes forming the first electrode 150 and the second electrodes 160, the product of the method for manufacturing the composite structure is the composite structure 10*b*.

<Composite Structure>

Figure 3:
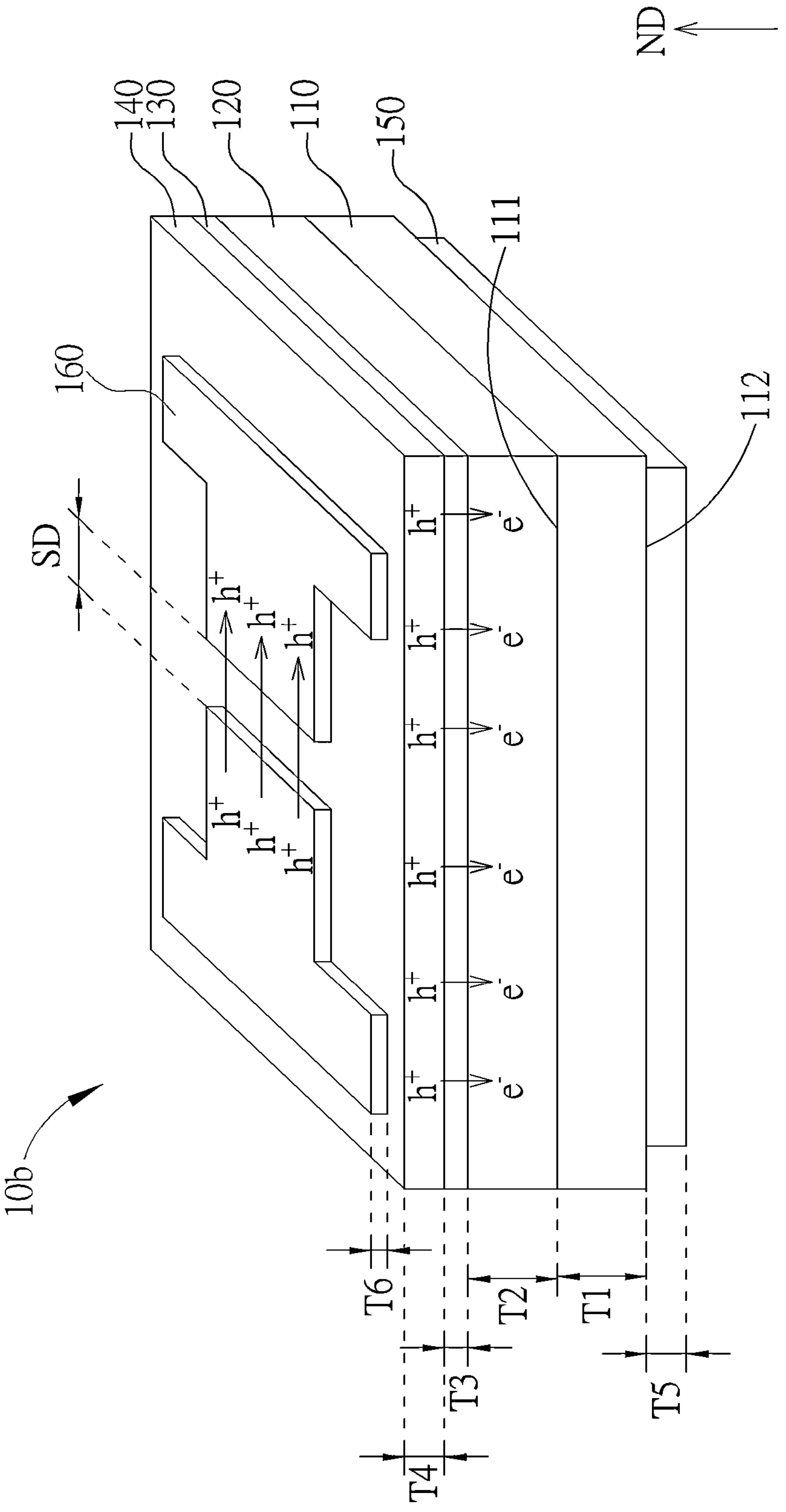
FIG. 3 is a three-dimensional diagram showing a composite structure according to an embodiment of the present disclosure.

Please refer to FIG. 3, which is a three-dimensional diagram showing a composite structure according to an embodiment of the present disclosure, in which the distribution of carriers after the composite structure being illuminated with light is shown. The composite structure 10*b* includes a silicon substrate 110, a dielectric layer 120, a two-dimensional graphene layer 130 and a carbon quantum dot film 140, and may optionally include a first electrode 150 and two second electrodes 160. The dielectric layer 120 is disposed on a first surface 111 of the silicon substrate 110, the two-dimensional graphene layer 130 is disposed on the dielectric layer 120, and the carbon quantum dot film 140 is disposed on the two-dimensional graphene layer 130. The first electrode 150 is disposed on a second surface 112 of the silicon substrate 110 opposite to the first surface 111. The two second electrodes 160 are spaced apart from each other on the carbon quantum dot film 140.

Figure 6:
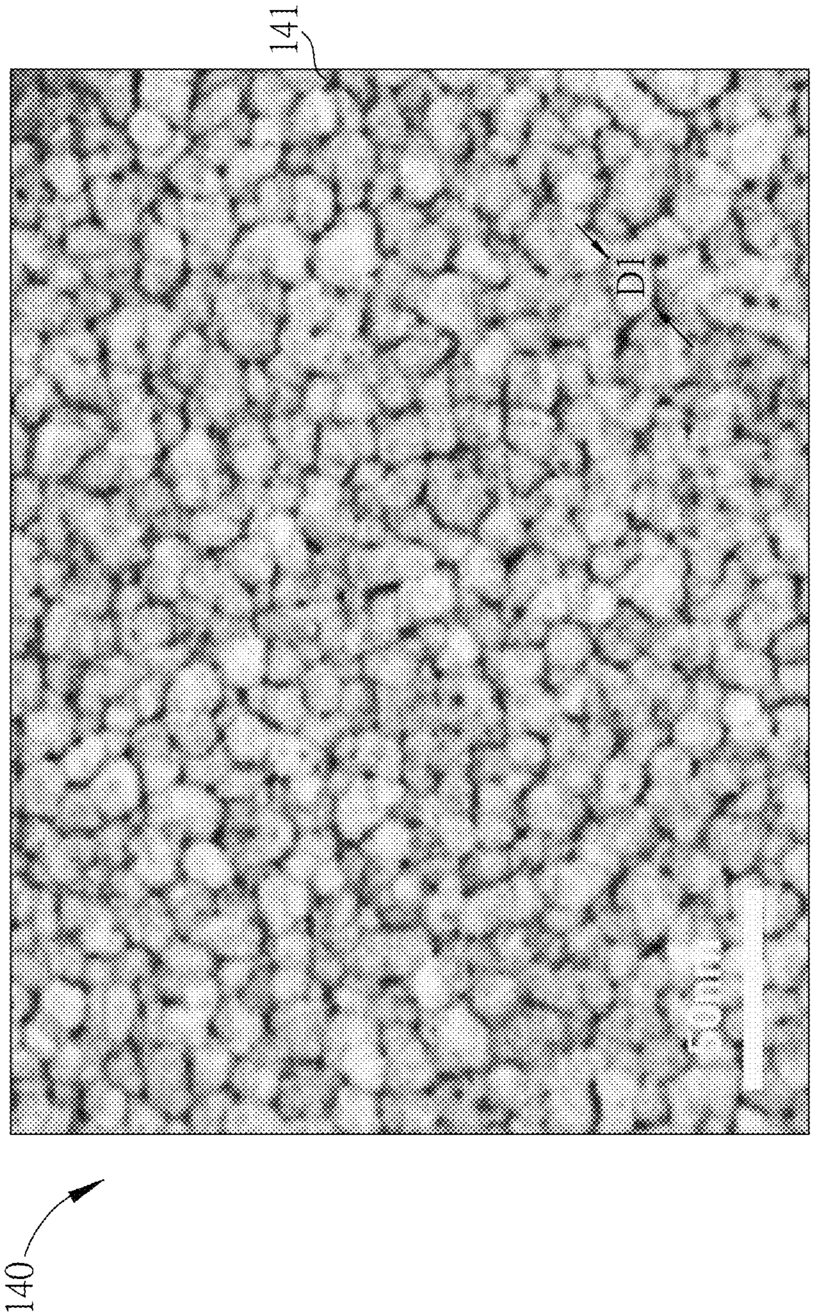
FIG. 6 is a SEM photograph showing a top view of the composite structure of Example 1 according to the present disclosure.

The carbon quantum dot film 140 may be stacked by a plurality of carbon quantum dots 141 (refer to FIG. 6). The plurality of carbon quantum dots 141 are combined through van der Waals force, and the plurality of carbon quantum dots 141 are stacked tightly to form a thin film. For details of the carbon quantum dot film 140, reference may be made to the relevant description of FIG. 6.

The shape of the first electrode 150 is a rectangle, the shape of the second electrode 160 is a T-shaped shape, and the two second electrodes 160 overlap the first electrode 150 in a vertical direction. The vertical direction may be parallel to the normal direction ND of the first surface 111 of the silicon substrate 110. There is a spaced distance SD between the two second electrodes 160, and the spaced distance SD may be 0.01 cm to 0.05 cm. With the first electrode 150 being configured in a rectangle, it is beneficial to expand the contact area between the first electrode 150 and the silicon substrate 110 as much as possible. With each of the second electrode 160 being configured in a T-shaped shape, it is beneficial to shorten the spaced distance SD, so as to improve the transport efficiency of the carrier channel between the two second electrodes 160. With the two second electrodes 160 overlapping the first electrode 150 in the vertical direction, when a vertical voltage (such as a gate voltage (Vas)) is applied, positive and negative charges may be induced in the vertical direction, the induced charges may recombine with the originally stored carriers, so as to achieve the effect of erasing signals.

When the power module (not shown) provides voltage to the two second electrodes 160, a carrier channel may be formed between the two second electrodes 160. Based on the function, the composite structure 10*b* may be regarded as a transistor, the two second electrodes 160 may be regarded as the drain electrode and the source electrode of the transistor, and the first electrode 150 may be regarded as the gate electrode of the transistor. Therefore, in the following description, the two second electrodes 160 are also called drain electrode/source electrode, the first electrode 150 is also called a gate electrode, the voltage applied to the two second electrodes 160 may be called the drain/source voltage ($V_{DS}$), and the voltage applied to the first electrode 150 may be called the gate voltage ($V_{GS}$). When the composite structure 10*b* is illuminated with light, due to the two-dimensional graphene layer 130 has the ability to attract electrons $e^-$, the electrons $e^-$ move downward and are constrained in the two-dimensional graphene layer 130 and the dielectric layer 120, which causes the separation between the electrons $e^-$ and the electron hole $h^+$. As a result, the transport of carriers between the two second electrodes 160 is improved significantly.

The composite structure 10*b* may be manufactured by the aforementioned method for manufacturing the composite structure. For details of the silicon substrate 110, the dielectric layer 120, the two-dimensional graphene layer 130, the carbon quantum dot film 140, the first electrode 150 and the second electrodes 160, reference may be made to the relevant description above and are not repeated herein.

<Non-Volatile Optical Memory Device>

Figure 4:
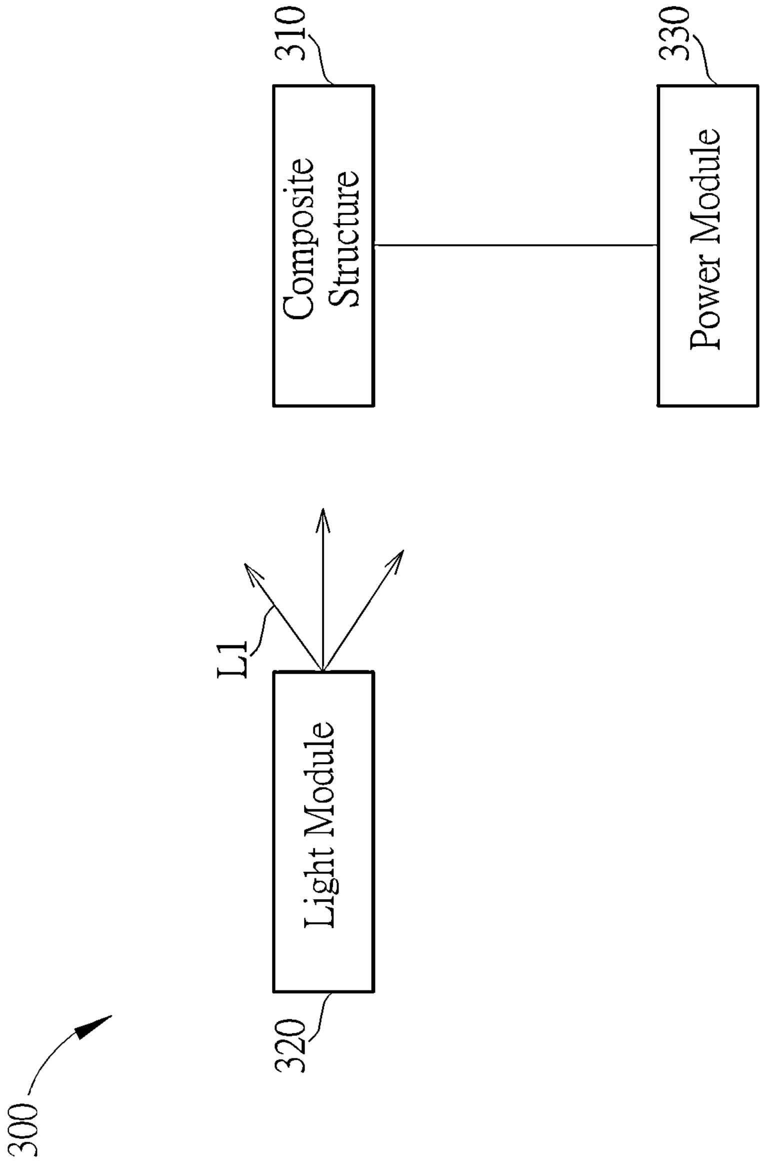
FIG. 4 is a functional block diagram of a non-volatile optical memory device according to an embodiment of the present disclosure.

Please refer to FIG. 4, which is a functional block diagram of a non-volatile optical memory device according to an embodiment of the present disclosure. The non-volatile optical memory device 300 includes a composite structure 310, a light module 320 and a power module 330. The light module 320 is for providing lights L1 to the composite structure 310. The lights L1 may be ultraviolet lights, the wavelengths of the lights L1 may be 300 nm to 400 nm, and the intensities of the lights L1 may be 0.5 $mWcm^{-2}$ to 70 $mWcm^{-2}$. The power module 330 is electrically connected with the composite structure 310. The power module 330 is for providing voltages to the composite structure 310.

Preparation of Example 1

Example 1: a composite substrate is provided, the composite substrate includes a silicon substrate and a layer of silicon dioxide, the specifications of the silicon substrate are shown in Table 1, and a thickness of the layer of the silicon dioxide is 150 nm.

TABLE 1

| Type | N |
|---|---|
| Orientation | <100> |
| Thickness | 525 ± 25 (μm) |
| Resistivity | 0.01 – 0.05 (Ω · cm) |

A copper foil is put into a chemical vapor deposition system. After evacuating the chemical vapor deposition system, the reaction gases, methane (CH4) and hydrogen (H2), are introduced into the chemical vapor deposition system to form a two-dimensional graphene layer on the copper foil.

Next, PMMA and acetone are mixed to form a polymer spin coating liquid, then the polymer spin coating liquid are spin coated on the two-dimensional graphene layer at a rotational speed of 3000 rpm to 4000 rpm for 30 seconds to 60 seconds at room temperature. Afterward, a baking step is performed at 80° C. for 20 minutes to solidify the PMMA.

Next, the copper foil disposed with the two-dimensional graphene layer and the PMMA is immersed in a ferric nitrate solution of 1.25M for 12 hours to 24 hours to remove the copper foil. The two-dimensional graphene layer and the PMMA are immersed in deionized water several times to remove the remaining ferric nitrate solution. Then the two-dimensional graphene layer and the PMMA are picked up by the composite substrate from the deionized water and are supported by the composite substrate, and then are heated at 150° C. for 0.5 hours to remove the deionized water. Next, the composite substrate and the two-dimensional graphene layer and the PMMA supported by the composite substrate are together immersed in acetone for 48 hours to 72 hours at 65° C. to remove the PMMA. Next, the composite substrate and the two-dimensional graphene layer supported by the composite substrate are together heated at 200° C. for 20 minutes to 30 minutes to remove the residual liquid thereon.

A carbon quantum dot precursor solution with a glucose concentration of 1 wt % is prepared with 2M hydrochloric acid aqueous solution being the solvent and the glucose being the solute. The carbon quantum dot precursor solution is heated to 100° C. and then is coated on the two-dimensional graphene layer by a drop-casting process. Then the two-dimensional graphene layer and the carbon quantum dot precursor solution coated on the two-dimensional graphene layer are together heated to 150° C. and maintained at 150° C. for 2 hours, and then is heated to 400° C. at a rate of increasing 50° C. every half hour, so that a preliminary composite structure (the structure may refer to the composite structure 10*a* shown in FIG. 1) is obtained.

Next, the preliminary composite structure is put into an electron beam evaporation system with silver as the evaporation material to form the first electrode and the second electrodes to obtain the composite structure (the structure may refer to the composite structure 10*b* shown in FIG. 1). In the present disclosure, whether to form the first electrode and the second electrodes can be determined according to subsequent applications. In other words, the first electrode and the second electrodes of the present disclosure are optional elements.

Figure 5:
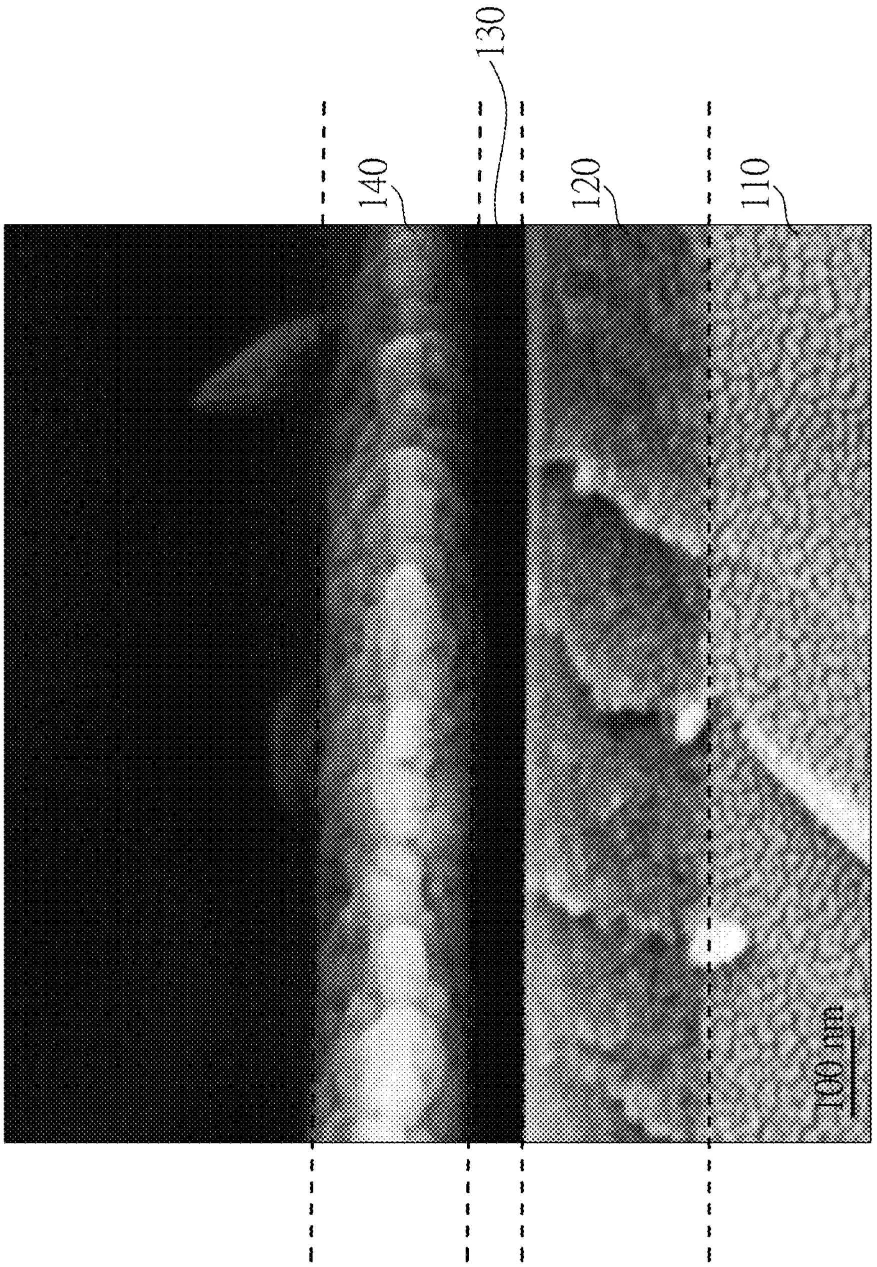
FIG. 5 is a scanning electron microscope (SEM) photograph showing a cross-sectional view of a composite structure of Example 1 according to the present disclosure.

The composite structure of Example 1 is processed to form a SEM specimen and observed by a SEM. Please refer to FIG. 5 and FIG. 6. FIG. 5 is a SEM photograph showing a cross-sectional view of the composite structure of Example 1 according to the present disclosure. FIG. 6 is a SEM photograph showing a top view of the composite, in which a top view of the carbon quantum dot film 140 can be observed. In FIG. 5, the composite structure includes, from bottom to top, the silicon substrate 110, the dielectric layer 120, the two-dimensional graphene layer 130 and the carbon quantum dot film 140. As shown in FIG. 5 and FIG. 6, the carbon quantum dot film 140 is stacked by a plurality of carbon quantum dots 141. The plurality of carbon quantum dots 141 are combined through van der Waals force, and the carbon quantum dots 141 are tightly stacked on the two-dimensional graphene layer 130. The particle sizes D1 of the carbon quantum dots 141 may be 8 nm to 15 nm, and the average particle size of the plurality of carbon quantum dots 141 is about 13 nm. In addition, it should be noted that when preparing the SEM specimen, gold particles are deposited on the composite structure in order to increase the conductivity for improving the clarity of the SEM images. The round particles in the silicon substrate 110 shown in FIG. 5 are the images of the gold particles.

<Property Measurement of Example 1>

Figure 7:
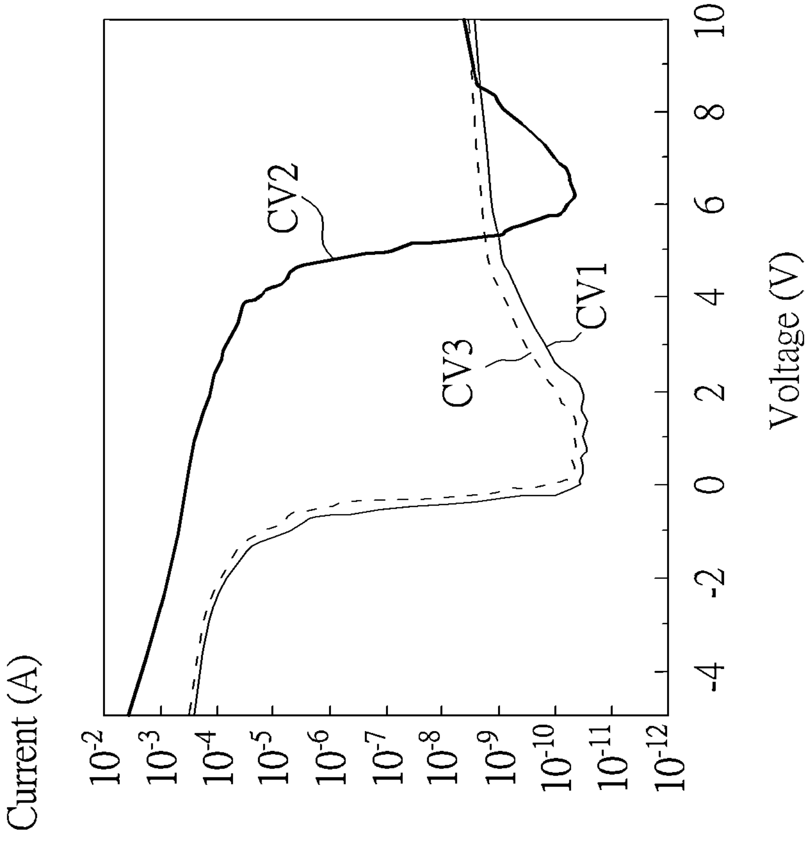
FIG. 7 shows a measurement result of transfer curve of Example 1 according to the present disclosure.
Figure 8:
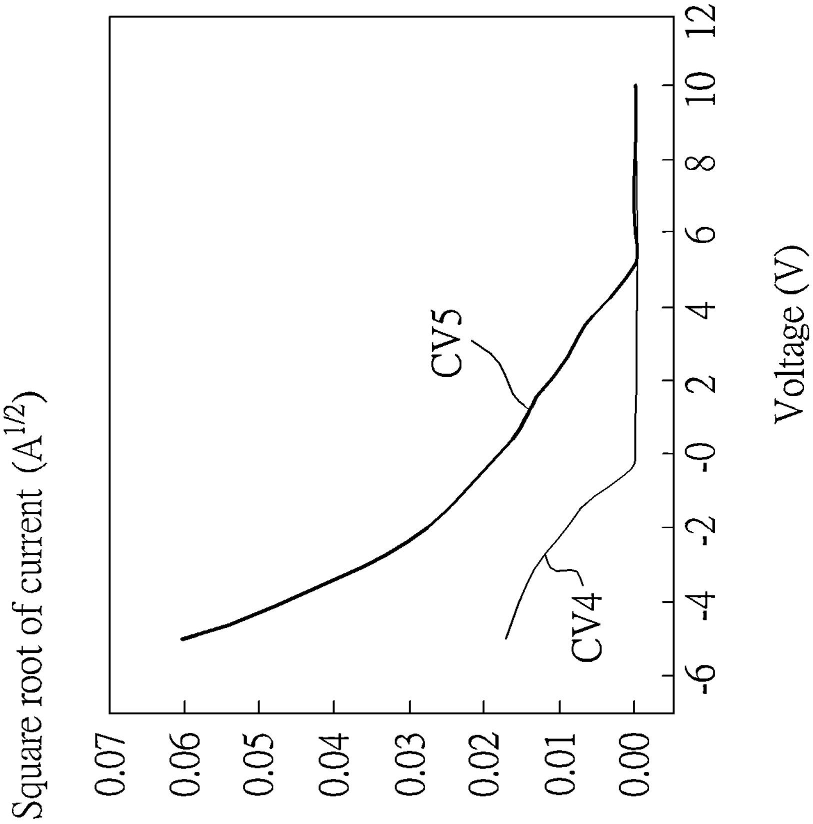
FIG. 8 shows another measurement result of transfer curve of Example 1 according to the present disclosure.

Please refer to FIG. 7 and FIG. 8. FIG. 7 shows a measurement result of transfer curve of Example 1 according to the present disclosure, and FIG. 8 shows another measurement result of transfer curve of Example 1 according to the present disclosure. The method for measuring the transfer curve is as follows. The composite structure of Example 1 is placed in a dark room box and is measured with a semiconductor measuring instrument (B1500A). During the measuring process, a fixed voltage (herein, 5 V) is provided to the two second electrodes, and a continuously changing voltage is provided to the first electrode (herein, from −5 V to 10V). That is, the change of the current output by the composite structure is observed by scanning the gate voltage. By plotting with the voltage of the first electrode as the horizontal axis and the current output by the composite structure as the vertical axis, the curve CV1, the curve CV2 and the curve CV3 in FIG. 7 can be obtained. The curve CV1 is the relationship between the current and the voltage of the composite structure at the initial stage, in which the composite structure has not yet been illuminated with light, and the composite structure at the initial stage may be called in an off state. The curve CV2 is the relationship between the current and the voltage obtained after the side of the composite structure disposed with the carbon quantum dot film is illuminated with light having a wavelength of 365 nm and an intensity of 40 $mWcm^{-2}$ for 40 seconds. After being illuminated with light, the composite structure may be called in an on state. The curve CV3 is the relationship between the current and the voltage obtained after erasing by applying the first electrode a voltage of −20 volts for 1 second. The aforementioned erasing refers to apply a voltage to the first electrode so that the dielectric layer can generate induced charges to neutralize/eliminate the charges generated by illuminating the composite structure with light. In FIG. 8, the curve CV4 and the curve CV5 8 are the results of taking the square roots of the current of the curve CV1 and the current of the curve CV1 curve CV2 respectively. When the composite structure has not yet been illuminated with light, the current output by the composite structure may be called a dark current. When the composite structure has been illuminated with light, the current output by the composite structure may be called a photocurrent.

In the curve CV1, when the voltage is 0 volts, the current (i.e., the dark current) is $3.4\times10^{-11}$ A. In the curve CV2, when the voltage is 0 volts, the current (i.e., the photocurrent) is $3.1\times10^{-4}$ A, and the current on/off ratio can be calculated to be $9.1\times10^{6}$, which shows that the composite structure of Example 1 has an excellent on/off ratio when the voltage applied to the first electrode is 0 volts. The excellent current on/off ratio means that the materials used in the composite structure (such as the carbon quantum dot film and the two-dimensional graphene layer) have excellent light absorption properties. As shown in the curve CV4, the critical voltage is about-0.5 V in the off state (i.e., has not yet been illuminated with light). That is, in the present disclosure, the composite structure can be written and read when the voltage applied to the first electrode is 0 volts. In other words, there is no need to supply power to the first electrode when the composite structure is written and read, which is beneficial to reduce the power consumption. According to the calculation result, when $V_{DS}$ is 5 V, Vas is 0 V, and the operation period is 1 second, the power consumption of the composite structure is 288 pW, which shows that operation of the composite structure of Example 1 is extremely power saving.

Comparing the curve CV1 and the curve CV2, the curve CV2 is shifted to the right relative to the curve CV1 due to the photogating effect of the composite structure, which shows that the concentration of the carriers (herein, the electron holes) in the composite structure has increased significantly. According to the calculation result, the change of carrier concentration is approximately $8.64\times10^{11}$ $cm^2$. The field effect carrier mobility (u) can be further calculated based on the slopes of the curve CV1 and the curve CV2 to be 109 $cm^2V^{-1}$ $S^{-1}$, which shows that the composite structure of Example 1 has excellent field effect carrier mobility, and may achieve fast and efficient transport.

Comparing the curve CV1 and the curve CV3, the curve CV3 and the curve CV1 has little difference, which shows that the composite structure of Example 1 can be erased by applying a voltage to the first electrode, so that the composite structure returns to the initial state. In other words, the composite structure of the present disclosure can be reused. In addition, comparing the curve CV4 and the curve CV5, it can be obtained that the memory window of the composite structure of Example 1 is approximately 5.4 V.

Figure 9:
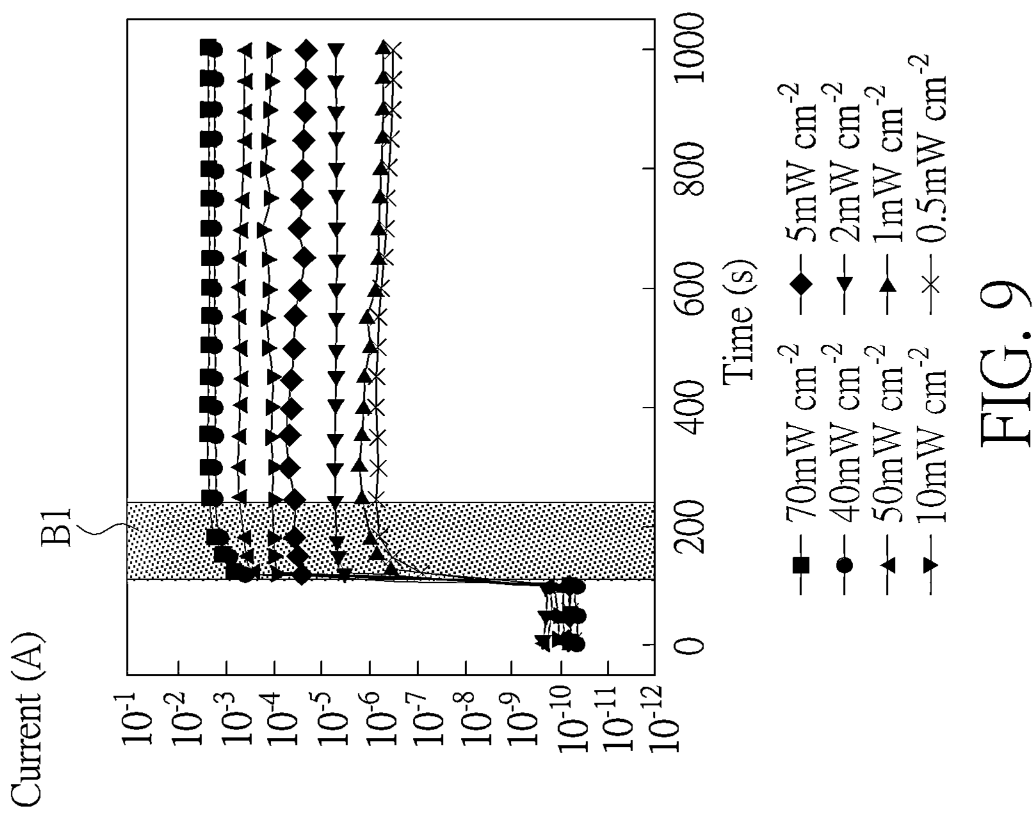
FIG. 9 shows the relationship between current and time under different illumination intensities of Example 1 according to the present disclosure.

Please refer to FIG. 9, which shows the relationship between current and time under different illumination intensities of Example 1 according to the present disclosure. The experimental method of FIG. 9 is as follows. The composite structure of Example 1 is placed in a dark room box and is measured with a semiconductor measuring instrument (B1500A). During the measuring process, a voltage of 5 V is applied to the two second electrodes and a voltage of 0 V is applied to the first electrode, and the composite structure is illuminated with light having a wavelength of 365 nm and an intensity of 0.5 $mWcm^{-2}$ from the 120th second to the 240th second (as shown in the time period corresponding to block B1 in FIG. 9), and the composite structure is not illuminated with light during the rest of the time, and the current output by the composite structure from the 0th second to the 1000th second is recorded. Afterward, the intensity of the light is adjusted, and the aforementioned experiment is repeated, so as to obtain the experimental results shown in FIG. 9. As shown in FIG. 9, when the composite structure of Example 1 is illuminated with light of the intensity from 0.5 $mWcm^{-2}$ to 70 $mWcm^{-2}$, significant photocurrent can be generated in a short time. In other words, the composite structure according to the present disclosure has an excellent current on/off ratio when the composite structure is illuminated with lights with different intensities. In addition, when the illumination is stopped, the intensity of the photocurrent can be maintained for at least 750 seconds, which shows that the composite structure according to the present disclosure can maintain a long-term non-volatile memory state and is suitable for the application of non-volatile memory device. When the light intensity is in the range from 0.5 $mWcm^{-2}$ to 40 $mWcm^{-2}$, the photocurrent is increased as the light intensity increases. When the light intensity is equal to or greater than 40 $mWcm^{-2}$, the photocurrent approaches or reaches a saturation value. In other words, the composite structure according to the present disclosure can be written photocurrents with different magnitudes by illuminating lights with different intensities. Photocurrents with different magnitudes can correspond to different device signals. Accordingly, it is possible to provide a memory configuration more than two bits in a single device. Compared with the traditional memory device that only can convert information into 0 and 1 signals and store the information in a two-bit configuration, the composite structure according to the present disclosure can provide a memory configuration more than two bits, which is beneficial to increase the memory density. When the amount of information is the same, the composite structure according to the present disclosure can significantly reduce the volume and power consumption.

Figure 10:
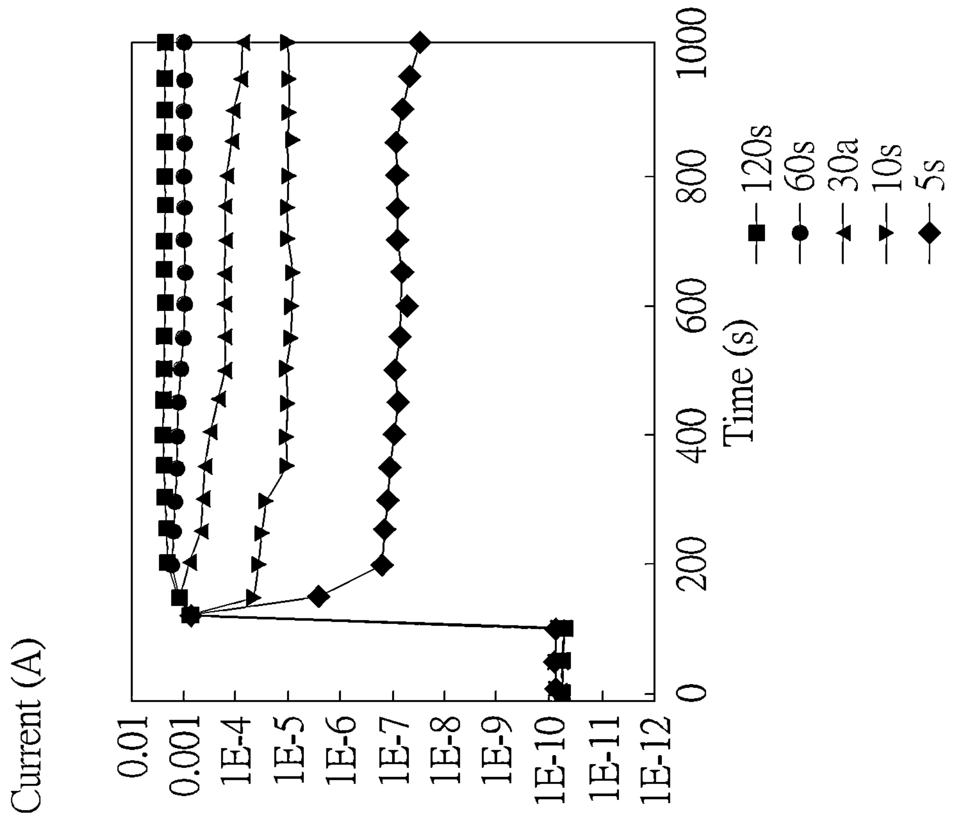
FIG. 10 shows the relationship between current and time under different illumination times of Example 1 according to the present disclosure.

FIG. 10 shows the relationship between current and time under different illumination times of Example 1 according to the present disclosure. The experimental method of FIG. 10 is as follows. The composite structure of Example 1 is placed in a dark room box and is measured with a semiconductor measuring instrument (B1500A). During the measuring process, a voltage of 5V is applied to the two second electrodes and a voltage of 0 V is applied to the first electrode, and the composite structure is illuminated with light having a wavelength of 365 nm and an intensity of 40 $mWcm^{-2}$ from the 100th second to the 105th second, and the composite structure is not illuminated with light during the rest of the time, and the current output by the composite structure from the 0th second to 1000th second is recorded. Afterward, the illumination time is adjusted, and the aforementioned experiment is repeated, so as to obtain the experimental results shown in FIG. 10. As shown in FIG. 10, when the illumination times are 5 seconds, 10 seconds and 30 seconds, the magnitude of the photocurrent attenuates after the illumination is stopped. When the illumination time is equal to or greater than 60 seconds, the photocurrent approaches or reaches a saturation value, and the photocurrent hardly attenuates after the illumination is stopped. In other words, the composite structure according to the present disclosure can provide a stable current on/off ratio by selecting an appropriate illumination time.

Figure 11:
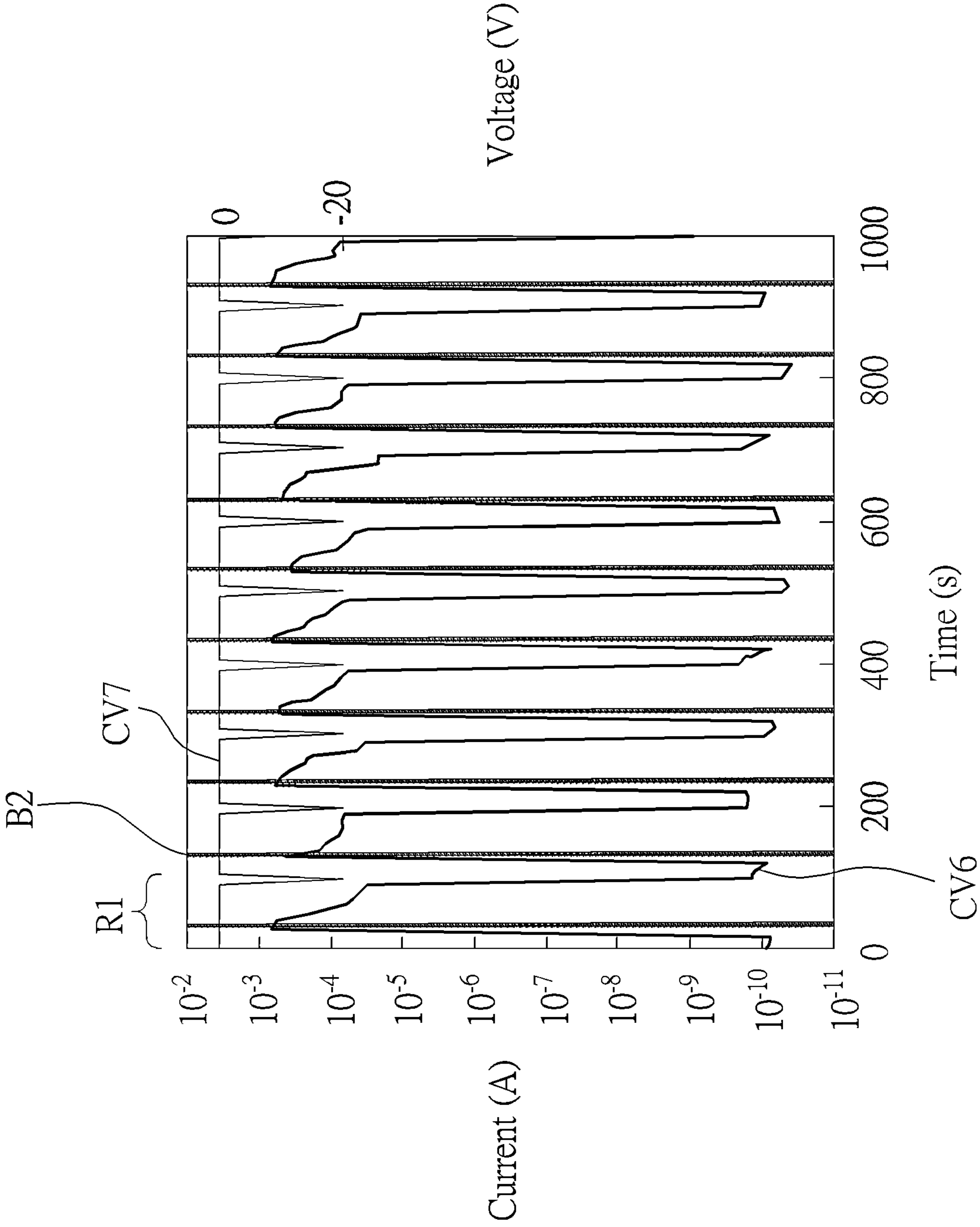
FIG. 11 shows a measurement result of a write-read-erase-read cycle of Example 1 according to the present disclosure.

Please refer to FIG. 11, which shows a measurement result of a write-read-erase-read cycle of Example 1 according to the present disclosure. The measurement method of FIG. 11 is as follows. The composite structure of Example 1 is placed in a dark room box and is measured with a semiconductor measuring instrument (B1500A). A voltage of 5V is continuously provided to the two second electrodes in each cycle R1, a voltage of 0 V is firstly provided to the first electrode in each cycle R1, and the composite structure is illuminated with light having a wavelength of 365 nm and an intensity of 40 $mWcm^{-2}$ for 10 seconds (i.e., the time period corresponding to the block B2 shown in FIG. 11) in each cycle R1, and then the voltage applied to the first electrode is changed to −20 V for erasing, and the aforementioned steps is repeated for 9 times (i.e., nine cycles R1). The measurement result is shown in FIG. 11. In FIG. 11, the horizontal axis represents the time of the experiment, the vertical axis on the left side represents the current output by the composite structure, and the vertical axis on the right side represents the voltage applied to the first electrode, the curve CV6 shows the relationship between the current output by the composite structure and the time, and the curve CV7 shows the relationship between the voltage applied to the first electrode and the time. As shown in FIG. 11, in each cycle R1, before illumination, applying a voltage of 5V to the two second electrodes (for reading) can cause the composite structure to generate a dark current. Next, the composite structure is illuminated with light, which causes the composite structure to generate photocurrent (for writing), and the current output by the composite structure increases significantly. Next, a voltage of −20V is applied to the first electrode (for erasing). During the process of erasing, the current output by the composite structure decreases rapidly. Next, a voltage of 5V is applied to the second electrode (for reading), it can be found that the current output by the composite structure is substantially equal to the current output by the composite structure at the beginning, and the cycle can be repeated at least nine times. In other words, the composite structure according to the present disclosure can generate write-read-erase-read (RWER) cycle and is suitable for the application of memory device.

Figure 12:
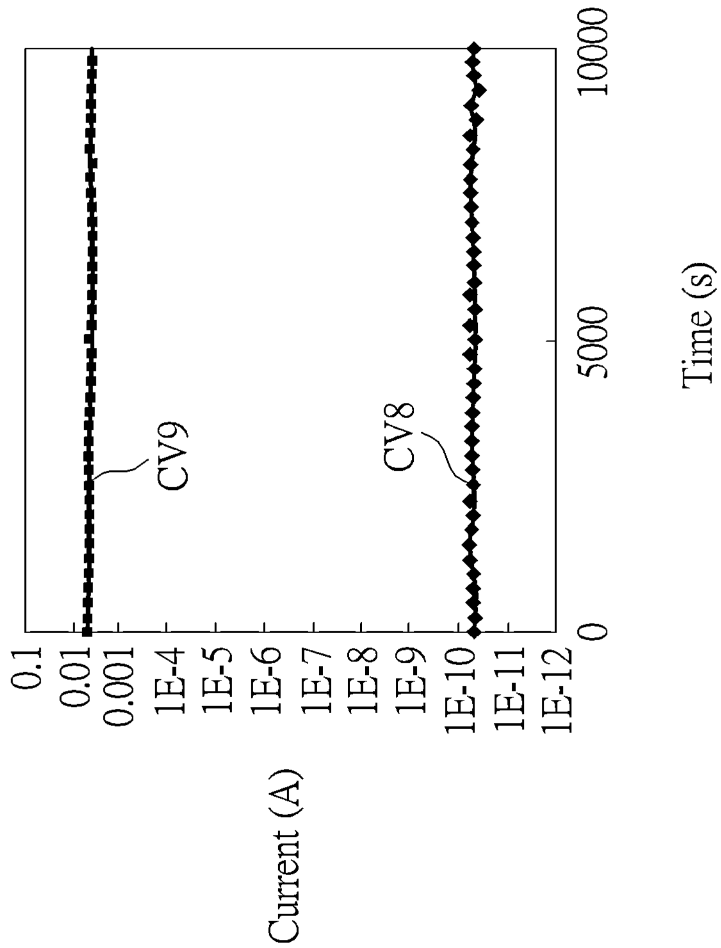
FIG. 12 shows the relationship between current and time without illumination and with illumination of Example 1 according to the present disclosure.

Please refer to FIG. 12, which shows the relationship between current and time without illumination and with illumination of Example 1 according to the present disclosure. The experimental method of FIG. 12 is as follows. The composite structure of Example 1 is placed in a dark room box and is measured with a semiconductor measuring instrument (B1500A). During the measuring process, a voltage of 5 V is applied to the two second electrodes, a voltage of 0 V is applied to the first electrode, and the relationship between the current output by the composite structure and the time without illumination is recorded, and the curve CV8 can be obtained. In addition, a voltage of 5V is applied to the two second electrodes, a voltage of 0 V is applied to the first electrode, and the composite structure is illuminated with a light having a wavelength of 365 nm and an intensity of 40 $mWcm^{-2}$ for 120 seconds. After the illumination is stopped, the relationship between the current output by the composite structure and time is recorded, and the curve CV9 is obtained. As shown in FIG. 12, when the composite structure of Example 1 is not illuminated, the dark current thereof is substantially maintained at $10^{-10}$ A, and after the illumination is stopped, the photocurrent thereof is substantially maintained at 0.01 A, which shows that the composite structure according to the present disclosure can provide long-term stability and reliability, and has excellent storage stability and reliability.

Compared with the prior art, the composite structure according to the present disclosure uses carbon quantum dots and two-dimensional graphene as materials. The carbon quantum dots and the two-dimensional graphene have advantages of excellent light absorption property, high environmental stability, and easy acquisition, so that the composite structure manufactured thereby can provide an excellent current on/off ratio, is suitable for storage at room temperature and atmospheric environment, and is beneficial to reduce production costs. In addition to provide the excellent current on/off ratio, the composite structure according to the present disclosure can also provide a long-term and stable non-volatile memory state and a memory configuration greater than two bits, can be applied to non-volatile optical memory devices and enable the non-volatile optical memory device manufactured thereby to have excellent storage stability and reliability, and is beneficial to enhance memory density. When the amount of information is the same, the non-volatile optical memory device according to the present disclosure can significantly reduce the volume and the power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A composite structure, comprising:
- a dielectric layer disposed on a first surface of a silicon substrate;
- a two-dimensional graphene layer disposed on the dielectric layer;
- a carbon quantum dot film disposed on the two-dimensional graphene layer;
- a first electrode disposed on a second surface of the silicon substrate opposite to the first surface; and
- two second electrodes disposed spaced apart from each other on the carbon quantum dot film.

2. A method for manufacturing the composite structure of claim 1, comprising:
- providing a composite substrate, wherein the composite substrate comprises the silicon substrate and the dielectric layer disposed on the first surface of the silicon substrate;
- forming the two-dimensional graphene layer on the dielectric layer;
- forming the carbon quantum dot film on the two-dimensional graphene layer;
- forming the first electrode on the second surface of the silicon substrate opposite to the first surface; and
- forming the two second electrodes spaced apart from each other on the carbon quantum dot film.

3. The method of claim 2, wherein the two-dimensional graphene layer is formed on the dielectric layer by a wet transfer process.

4. The method of claim 2, wherein forming the two-dimensional graphene layer on the dielectric layer comprises:
- forming the two-dimensional graphene layer on a metal substrate;
- forming a polymer material on the two-dimensional graphene layer;
- removing the metal substrate;
- supporting the polymer material and the two-dimensional graphene layer with the composite substrate; and
- removing the polymer material.

5. The method of claim 2, wherein forming the carbon quantum dot film on the two-dimensional graphene layer comprises:
- providing a carbon quantum dot precursor solution;
- coating the carbon quantum dot precursor solution on the two-dimensional graphene layer; and
- performing a thermal treatment process, so that the carbon quantum dot precursor solution is converted into the carbon quantum dot film.

6. The method of claim 5, wherein the carbon quantum dot precursor solution is coated on the two-dimensional graphene layer by a drop-casting process.

7. The method of claim 5, wherein the thermal treatment process comprises:
- performing a first heating step to achieve to a first predetermined temperature;
- performing a temperature holding step to maintain the first predetermined temperature for a predetermined period; and
- performing a second heating step, wherein the first predetermined temperature is raised to a second predetermined temperature.

8. A non-volatile optical memory device, comprising:
- the composite structure of claim 1; and
- a light module for providing a light to the composite structure.

* * * * *